United States Patent
Tsai et al.

(10) Patent No.: US 10,957,814 B2
(45) Date of Patent: Mar. 23, 2021

(54) ULTRAVIOLET C LIGHT-EMITTING DIODE HAVING ELECTRON BLOCKING LAYERS

(71) Applicant: Industrial Technology Research Institute, Hsinchu (TW)

(72) Inventors: Chia-Lung Tsai, Kaohsiung (TW); Hsueh-Hsing Liu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/431,748

(22) Filed: Jun. 5, 2019

(65) Prior Publication Data
US 2020/0194618 A1 Jun. 18, 2020

(30) Foreign Application Priority Data
Dec. 17, 2018 (TW) .................................. 107145438

(51) Int. Cl.
*H01L 33/04* (2010.01)
*H01L 33/06* (2010.01)
(Continued)

(52) U.S. Cl.
CPC ............ *H01L 33/06* (2013.01); *H01L 33/145* (2013.01); *H01L 33/32* (2013.01)

(58) Field of Classification Search
CPC .................................................. H01L 33/145
See application file for complete search history.

(56) References Cited

U.S. PATENT DOCUMENTS

| 8,987,755 | B1 | 3/2015 | Liao et al. |
| 9,281,437 | B2 * | 3/2016 | Kim ...................... H01L 33/32 |

(Continued)

FOREIGN PATENT DOCUMENTS

| CN | 104134730 | 11/2014 |
| CN | 106711301 | 5/2017 |

(Continued)

OTHER PUBLICATIONS

Frank Mehnke et al., "Efficient charge carrier injection into sub-250nm AlGaN multiple quantum well light emitting diodes," Journal of Applied Physics Letters, vol. 105, Issue 5, Aug. 8, 2014, pp. 1-4.

(Continued)

*Primary Examiner* — Suberr L Chi
(74) *Attorney, Agent, or Firm* — JCIPRNET

(57) ABSTRACT

An ultraviolet C light-emitting diode includes an n-type semiconductor layer, a p-type semiconductor layer, an active layer, a first electron blocking layer, and a second electron blocking layer. The active layer is disposed between the n-type semiconductor layer and the p-type semiconductor layer. The wavelength of the maximum peak of the spectrum emitted by the active layer ranges from 230 nanometers to 280 nanometers. The concentration of magnesium in the active layer is less than $10^{17}$ atoms/cm$^3$. The first electron blocking layer and the second electron blocking layer are disposed between the p-type semiconductor layer and the active layer. The concentration of magnesium in the second electron blocking layer is greater than that of the first electron blocking layer and is greater than $10^{18}$ atoms/cm$^3$.

20 Claims, 12 Drawing Sheets

(51) Int. Cl.
   *H01L 33/32*   (2010.01)
   *H01L 33/14*   (2010.01)

(56) References Cited

U.S. PATENT DOCUMENTS

| | | | |
|---|---|---|---|
| 9,780,254 B1 | 10/2017 | Liao et al. | |
| 2016/0163919 A1* | 6/2016 | Matsui | H01S 5/18369 257/13 |
| 2019/0296187 A1* | 9/2019 | Yoo | H01L 33/0075 |

FOREIGN PATENT DOCUMENTS

| | | |
|---|---|---|
| CN | 107331746 | 11/2017 |
| CN | 107689406 | 2/2018 |
| TW | I462334 | 11/2014 |
| WO | 2015001695 | 1/2015 |
| WO | 2018181044 | 10/2018 |

OTHER PUBLICATIONS

Frank Mehnke et al., "Effect of heterostructure design on carrier injection and emission characteristics of 295 nm light emitting diodes, " Journal of Applied Physics, vol. 117, Issue 19, May 21, 2015, pp. 1-6.

"Office Action of Taiwan Counterpart Application," dated Jul. 3, 2019, p. 1-p. 7.

"Office Action of China Counterpart Application", dated Oct. 29, 2020, pp. 1-7.

* cited by examiner

ULTRAVIOLET C LIGHT-EMITTING DIODE HAVING ELECTRON BLOCKING LAYERS

CROSS-REFERENCE TO RELATED APPLICATION

This application claims the priority benefits of Taiwan application serial no. 107145438, filed on Dec. 17, 2018. The entirety of the above-mentioned patent application is hereby incorporated by reference herein and made a part of this specification.

TECHNICAL FIELD

The technical field relates to an ultraviolet C light-emitting diode.

BACKGROUND

In order to make an electron hole carrier to be easily injected into a light-emitting layer, active layer or multiple-quantum well (MQW), an electron blocking layer (EBL) in an ultraviolet C light-emitting diode (UVC-LED) structure is doped with beryllium, magnesium or zinc, etc. to form a p-type semiconductor. In this way, in addition to increasing the electron hole concentration, the efficiency of the ultraviolet C light-emitting diode element can be further improved.

However, when the electron blocking layer is doped with beryllium, magnesium or zinc, etc., since the concentration of aluminum in the electron blocking layer is greater than the concentration of aluminum in the quantum barrier in the light-emitting layer, active layer or multiple-quantum well (MQW), it is not easy for beryllium, magnesium or zinc, etc. to be doped. On the other hand, if the doping amount of beryllium, magnesium or zinc, etc. is increased, the problem of memory effect of beryllium, magnesium, zinc, etc. and its diffusion into the quantum well or quantum barrier will be caused. As a result, excessive impurities may form defects in the quantum well or quantum barrier, resulting in a decrease in the luminous efficiency of the ultraviolet C light-emitting diode device and an unnecessary defect illumination.

SUMMARY

An embodiment of the disclosure provides an ultraviolet C light-emitting diode including an n-type semiconductor layer, a p-type semiconductor layer, an active layer, a first electron blocking layer and a second electron blocking layer. The active layer is located between the n-type semiconductor layer and the p-type semiconductor layer, and the wavelength of the maximum peak of the spectrum emitted by the active layer ranges from 230 nm to 280 nm, and the concentration of magnesium in the active layer is less than $10^{17}$ atoms/cm$^3$. The first electron blocking layer and the second electron blocking layer are located between the p-type semiconductor layer and the active layer, the concentration of magnesium in the second electron blocking layer is greater than the concentration of magnesium in the first electron blocking layer, and the concentration of magnesium in the second electron blocking layer is greater than $10^{18}$ atoms/cm$^3$.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
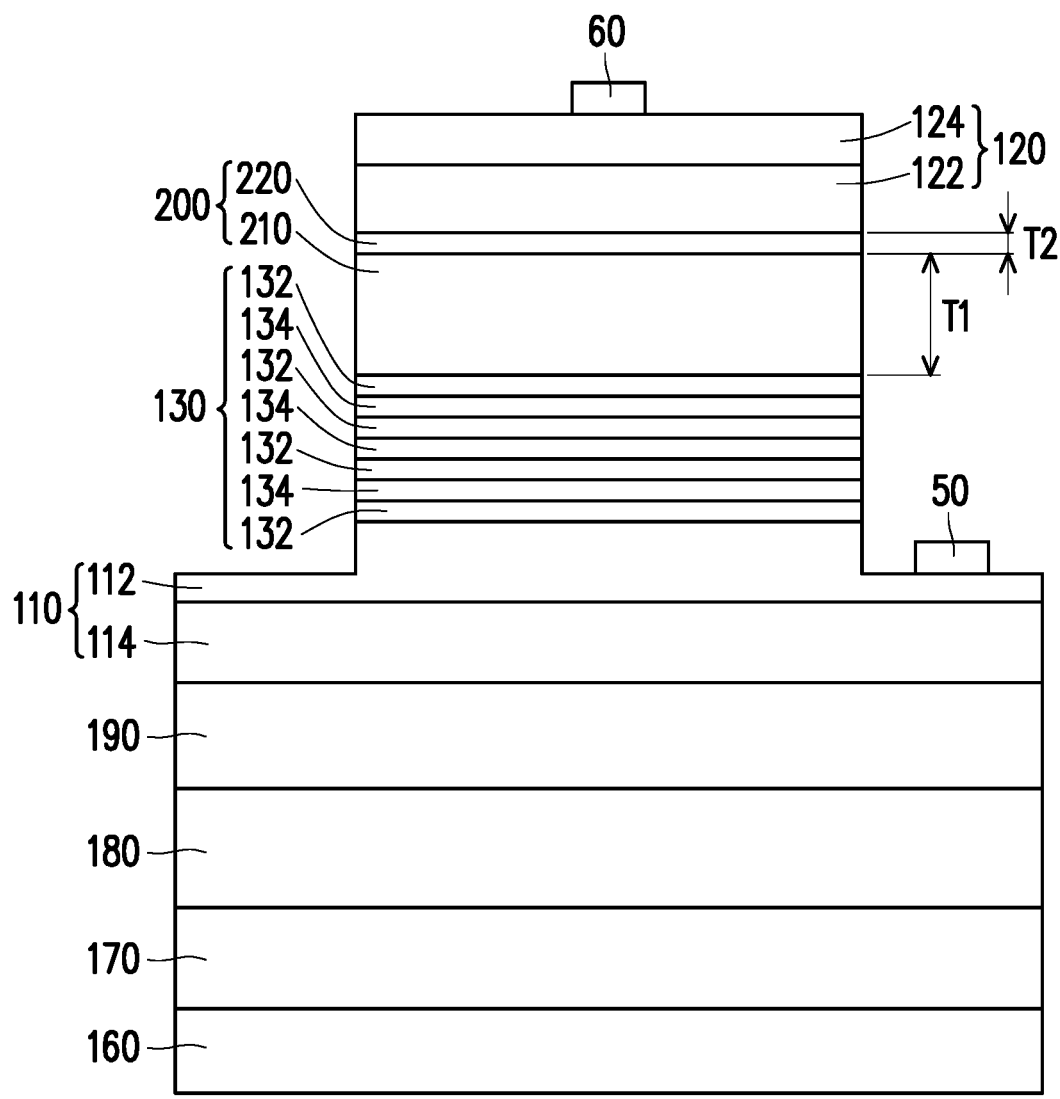
FIG. 1 is a schematic cross-sectional view of an ultraviolet C light-emitting diode according to an embodiment of the disclosure.

FIG. 1 is a schematic cross-sectional view of an ultraviolet C light-emitting diode according to an embodiment of the disclosure. Referring to FIG. 1, the ultraviolet C light-emitting diode 100 of the present embodiment includes an n-type semiconductor layer 110, a p-type semiconductor layer 120, an active layer or a multiple-quantum well 130, and an electron blocking layer 200. The n-type semiconductor layer 110 is, for example, an n-type aluminum gallium nitride layer, which may have a doping source (for example, carbon or silicon) of group IVA element, and the doping source of the group IVA element is used to replace aluminum or gallium atoms, and thus generating additional free electrons, or may have a doping source of group VIA element, the doping source of the group VIA element is used to replace the nitrogen atom, and thus generating additional free electrons, or may have a doping source of other elements, which replaces aluminum, gallium, and nitrogen and exhibits the feature of generating additional free electrons. In this embodiment, the ultraviolet C light-emitting diode 100 further includes a sapphire substrate 160, an aluminum nitride template layer 170, a buffer layer 180, and an unintentionally doped aluminum gallium nitride layer 190, wherein the aluminum nitride template layer 170, the buffer layer 180, the unintentionally doped aluminum gallium nitride layer 190, and the n-type semiconductor layer 110 are sequentially stacked on the sapphire substrate 160. The material of the buffer layer 180 is, for example, aluminum gallium nitride, and the cationic molar fraction of aluminum ranges from 95% to 50%, and the cationic molar fraction of gallium ranges from 5% to 50%. Alternatively, the buffer layer 180 may be an aluminum gallium nitride layer having a superlattice structure, of which the cationic molar fraction of aluminum ranges from 95% to 50%, and the cationic molar fraction of gallium ranges from 5% to 50%.

In the present embodiment, the n-type semiconductor layer 110 includes a first n-type aluminum gallium nitride layer 112 and a second n-type aluminum gallium nitride layer 114, wherein the n-type doping concentration of the first n-type aluminum gallium nitride layer 112 is higher than the n-type doping concentration of the second n-type aluminum gallium nitride layer 114, and the second n-type aluminum gallium nitride layer 114 and the first n-type aluminum gallium nitride layer 112 are sequentially stacked on the unintentionally doped aluminum gallium nitride layer 190.

The active layer 130 is a light-emitting layer. In the embodiment, the active layer 130 is a multiple-quantum well (MQW) layer including a plurality of barrier layers 132 and a plurality of well layers 134 stacked alternately on the n-type semiconductor layer 110. In this embodiment, the material of both of the barrier layer 132 and the well layer 134 is aluminum gallium nitride, except that the aluminum concentration in the barrier layer 132 is higher than that in the well layer 134.

The electron blocking layer 200 includes a first electron blocking layer 210 and a second electron blocking layer 220. In this embodiment, the first electron blocking layer 210 and the second electron blocking layer 220 are sequentially stacked on the active layer 130. The first electron blocking layer 210 and the second electron blocking layer 220 are, for example, aluminum gallium nitride layers doped with magnesium, wherein the concentration of magnesium in the second electron blocking layer 220 is greater than the concentration of magnesium in the first electron blocking layer 210, and the concentration of magnesium in the second electron blocking layer 220 is greater than $10^{18}$ atoms/cm$^3$.

The p-type semiconductor layer 120 is stacked on the electron blocking layer 200. In this embodiment, the p-type semiconductor layer 120 includes a first p-type gallium nitride or aluminum gallium nitride layer 122 and a second p-type gallium nitride or aluminum gallium nitride layer 124 sequentially stacked on the electron blocking layer 200, wherein the p-type doping concentration of the second p-type gallium nitride or aluminum gallium nitride layer 124 is higher than the p-type doping concentration of the first p-type gallium nitride or aluminum gallium nitride layer 122. The p-type dopant in the first p-type gallium nitride or aluminum gallium nitride layer 122 and the second p-type gallium nitride or aluminum gallium nitride layer 124 may be a group IIA element, such as beryllium or magnesium, and magnesium is used in the embodiment.

In this embodiment, the active layer 130 is disposed between the n-type semiconductor layer 110 and the p-type semiconductor layer 120, and the wavelength of the maximum peak of the spectrum emitted by the active layer 130 ranges from 230 nm to 280 nm, that is, falling within the wavelength band of ultraviolet C. The ultraviolet wavelength band includes ultraviolet A (UVA) band, ultraviolet B (UVB) band and ultraviolet C (UVC) band. The wavelength of the ultraviolet A band ranges about from 400 nm to 315 nm, that is, its photon energy range is about 3.10 eV to 3.94 eV. The wavelength of ultraviolet B band ranges about from 315 nm to 280 nm, that is, its photon energy range is about 3.94 eV to 4.43 eV. The wavelength of ultraviolet C band ranges about from 280 nm to 100 nm, that is, its photon energy range is about 4.43 eV to 12.4 eV. The concentration of magnesium in the active layer 130 is less than $10^{17}$ atoms/cm$^3$. Further, the first electron blocking layer 210 and the second electron blocking layer 220 are located between the p-type semiconductor layer 120 and the active layer 130. In the embodiment, the second electron blocking layer 220 is located between the first electron blocking layer 210 and the p-type semiconductor layer 120.

The ultraviolet C light-emitting diode 100 of the embodiment may further include a first electrode 50 and a second electrode 60, wherein the first electrode 50 is electrically connected to the n-type semiconductor layer 110, and the second electrode 60 is electrically connected to the p-type semiconductor layer 120. By applying a forward bias to the first electrode 50 and the second electrode 60, the active layer 130 of the ultraviolet C light-emitting diode 100 can emit an ultraviolet C band by radiative recombination. In FIG. 1, the first electrode 50 and the second electrode 60 are exemplified in the form of horizontal arrangement, that is, the first electrode 50 and the second electrode 60 are located on the same side of the ultraviolet C light-emitting diode 100. However, in other embodiments, the first electrode 50 and the second electrode 60 may also be in a vertical configuration, that is, the first electrode 50 is located below the n-type semiconductor layer 110, and the second electrode 60 is located above the p-type semiconductor layer 120.

In the ultraviolet C light-emitting diode 100 of the present embodiment, since it is designed that the concentration of magnesium in the second electron blocking layer 220 is greater than the concentration of magnesium in the first electron blocking layer 210, and the concentration of magnesium in the second electron blocking layer 220 is greater than $10^{18}$ atoms/cm$^3$, the doping of magnesium in a specific ratio relationship can effectively suppress the electrons in the active layer 130 from overflowing to the p-type semiconductor layer 120, thereby improving the device performance of the ultraviolet C light-emitting diode 100. In addition, in the ultraviolet C light-emitting diode 100 of the present embodiment, with the adjustment of appropriate cationic molar fraction of aluminum and the appropriate doping amount of magnesium in the electron blocking layer 200, not only that it is possible to prevent the electrons from overflowing to the p-type semiconductor layer 120, but also the efficiency of injecting the hole carriers into the active layer 130 can be improved, thereby increasing the luminous efficiency of the ultraviolet C light-emitting diode 100.

In this embodiment, the thickness T2 of the second electron blocking layer 220 falls within a range of 0.1 nm to 20 nm, and the thickness T1 of the first electron blocking layer 210 falls with a range of 10 nm to 100 nm.

Figure 2:
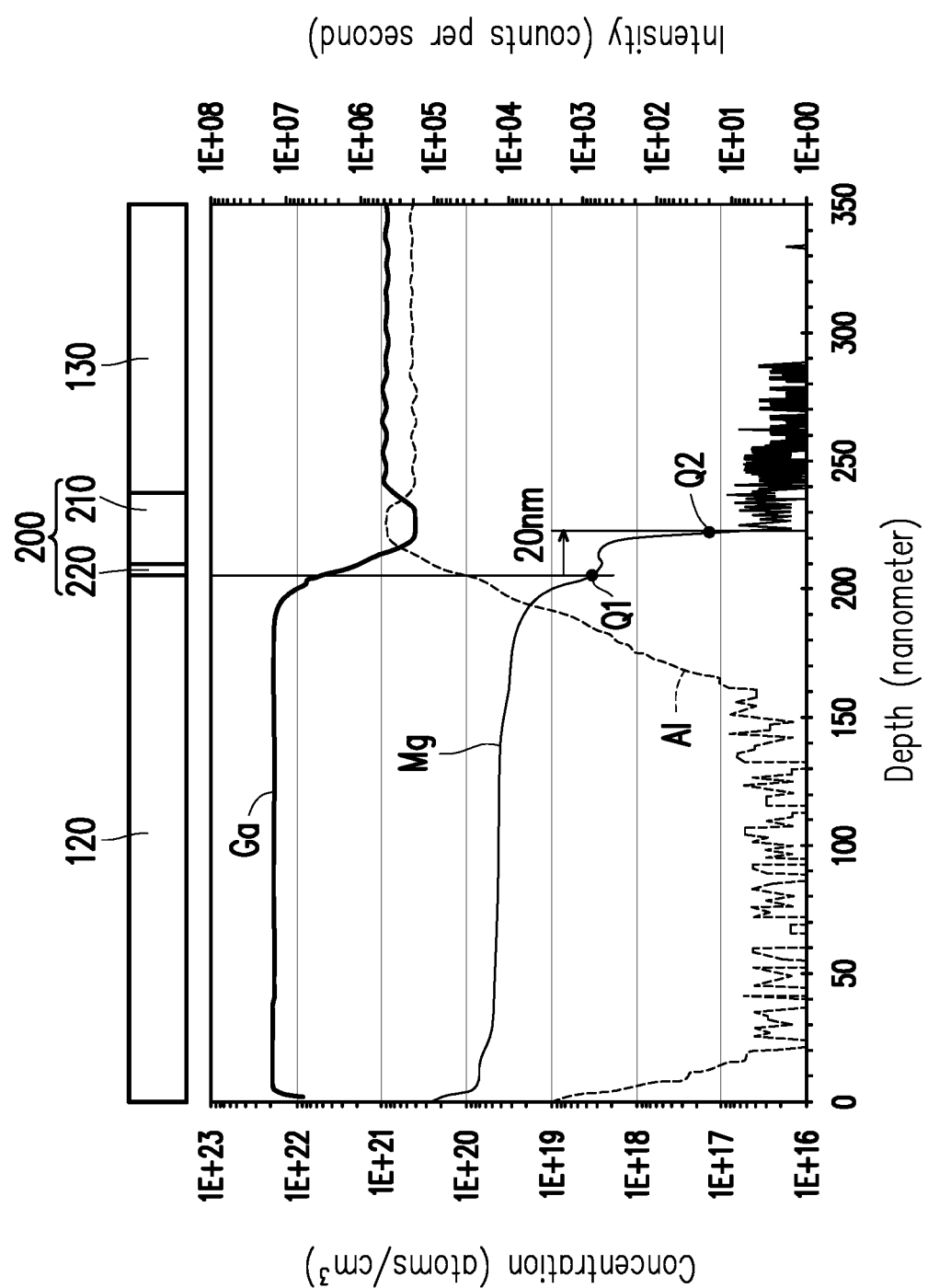
FIG. 2 is a diagram showing the ingredient distribution of the ultraviolet C light-emitting diode of FIG. 1 measured by a secondary ion mass spectrometer.
Figure 3:
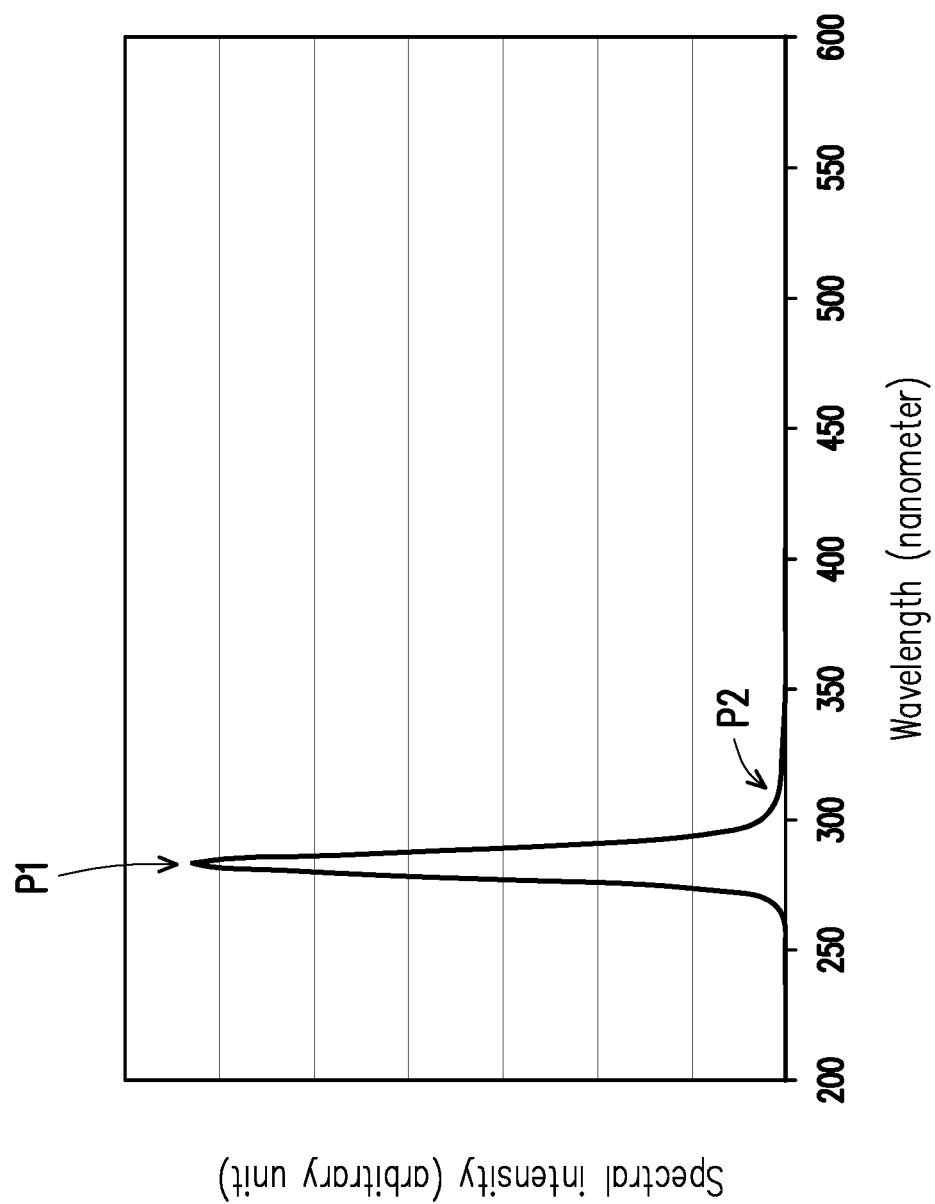
FIG. 3 is a spectrum diagram of the ultraviolet C light-emitting diode of FIG. 1.

FIG. 2 is a diagram showing the ingredient distribution of the ultraviolet C light-emitting diode of FIG. 1 measured by a secondary ion mass spectrometer (SIMS). FIG. 3 is a spectrum diagram of the ultraviolet C light-emitting diode of FIG. 1. Referring to FIG. 1 to FIG. 3, the spectrum of the light emitted by the ultraviolet C light-emitting diode 100 of the present embodiment includes a first light-emitting peak P1 and a second light-emitting peak P2, and the spectral intensity of the first light-emitting peak P1 is 20 or more times the spectral intensity of the second light-emitting peak P2. In FIG. 3, the second light-emitting peak P2 is not obvious, but if a logarithm value is taken from the vertical axis (i.e., spectral intensity), the second light-emitting peak P2 is clearly shown, which is because that the magnitude of the difference between the spectral intensity of the first light-emitting peak P1 and the spectral intensity of the second light-emitting peak P2 is too large so that the second light-emitting peak P2 cannot be seen in FIG. 3, but the second light-emitting peak P2 becomes obvious after a logarithm value is taken from the vertical axis. In the present embodiment, the difference obtained by subtracting the wavelength of the first light-emitting peak P1 from the wavelength of the second light-emitting peak P2 falls within the range of 20 nm to 40 nm. The second light-emitting peak P2 is generated by the defect illumination. In FIG. 3, it is apparently to be seen that the defect illumination of the ultraviolet C light-emitting diode 100 of the present embodiment is well suppressed, so the ultraviolet C light-emitting diode 100 has good luminous efficiency.

In the present embodiment, the highest concentration (for example, the concentration of magnesium at point Q1 in FIG. 2) of magnesium in the second electron blocking layer 220 is 5 to 200 times the lowest concentration (for example, the concentration of magnesium at point Q2 in FIG. 2) of magnesium in the first electron blocking layer 210, and is 20 to 80 times in another embodiment. Further, in the present embodiment, the concentration of magnesium in the second electron blocking layer 220 is ½ to 1/50 times the concentration of magnesium in the p-type semiconductor layer 120. In addition, in the present embodiment, a distribution curve of the whole concentration of magnesium in the first electron blocking layer 210 and the second electron blocking layer 220 from the p-type semiconductor layer 120 to the active layer 130 is steep-down at the beginning and then flattened and finally steep-down as shown in FIG. 2.

In this embodiment, the cationic molar fraction of aluminum in the first electron blocking layer 210 and the second electron blocking layer 220 falls within a range of 60% to 80%. For example, when the chemical formula of the main ingredient of the first electron blocking layer 210 and the second electron blocking layer 220 can be expressed as $Al_xGa_{1-x}N$, then x in the chemical formula is the cationic molar fraction of aluminum.

In the present embodiment, the refractive index of the second electron blocking layer 220 is smaller than the refractive index of the well layer 134 of the active layer 130 and smaller than the refractive index of the barrier layer 132 of the active layer 130. In addition, the refractive index of the first electron blocking layer 210 is also smaller than the refractive index of the well layer 134 of the active layer 130 and smaller than the refractive index of the barrier layer 132 of the active layer 130. In general, in the material of aluminum gallium nitride, the higher the content of aluminum, the smaller the refractive index.

In the ultraviolet C light-emitting diode 100 of the present embodiment, since the second electron blocking layer 220 is located between the first electron blocking layer 210 and the p-type semiconductor layer 120, the magnesium can be effectively doped in the second electron blocking layer 220 such that the magnesium is not diffused into the active layer 130 in a gradient distribution. In this way, the defect illumination induced by the magnesium entering the active layer 130 can be effectively reduced, thereby improving the luminous efficiency of the ultraviolet C light-emitting diode 100. In the present embodiment, the luminous intensity or the light output power of the ultraviolet C light-emitting diode 100 is 17.4 mW.

Figure 4:
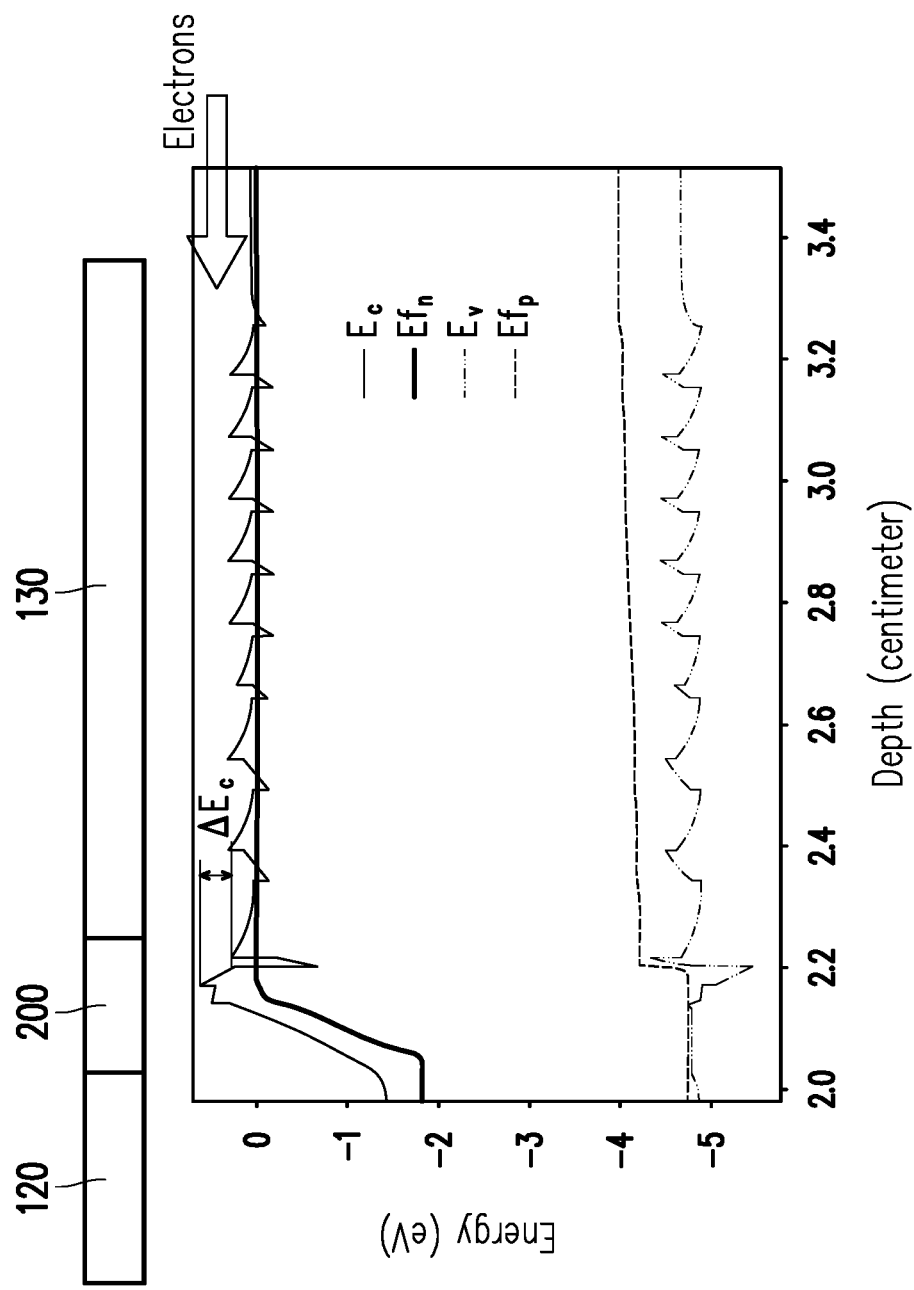
FIG. 4 is an energy band diagram of an ultraviolet C light-emitting diode in a comparative example.
Figure 5:
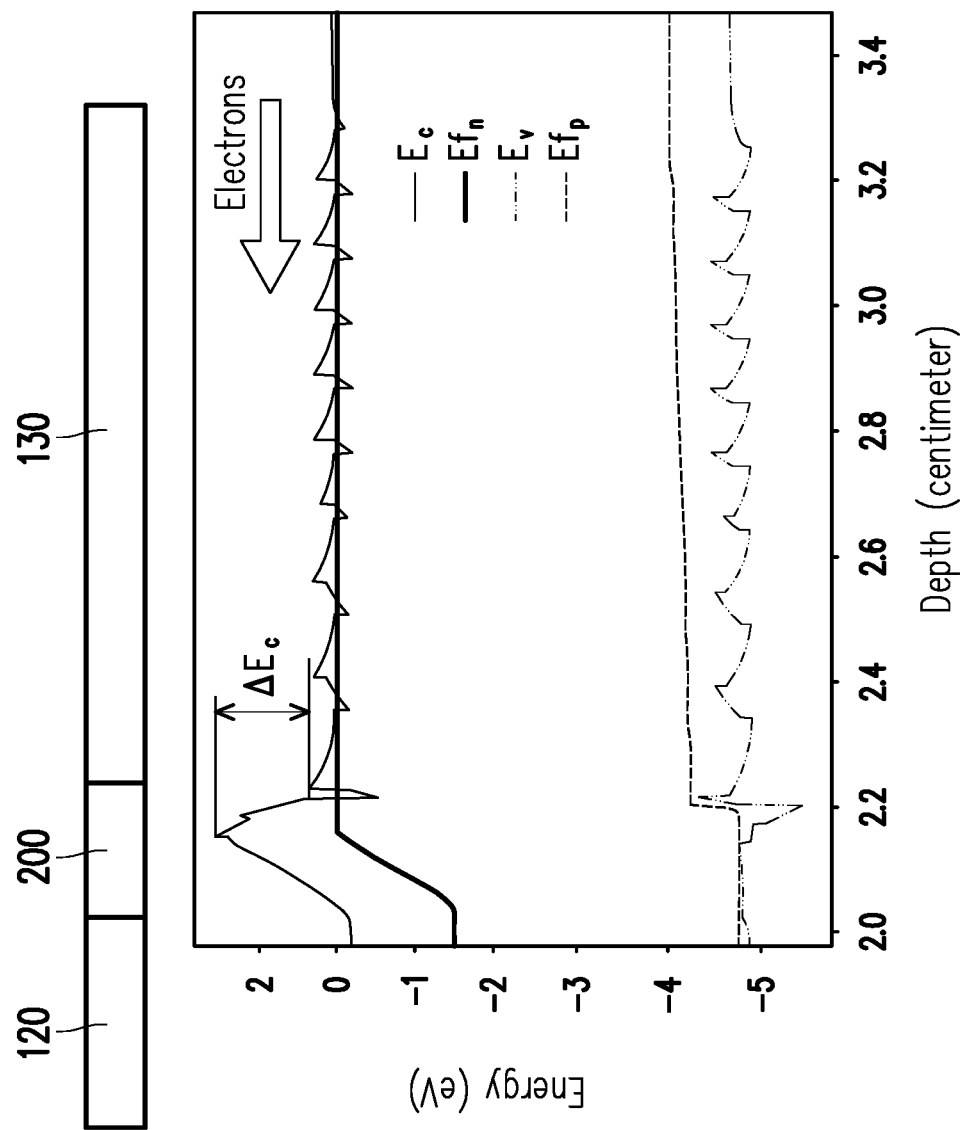
FIG. 5 is an energy band diagram of the ultraviolet C light-emitting diode of FIG. 1.

FIG. 4 is an energy band diagram of an ultraviolet C light-emitting diode in a comparative example. FIG. 5 is an energy band diagram of the ultraviolet C light-emitting diode of FIG. 1. Referring to FIG. 1, FIG. 4 and FIG. 5, the structures of the ultraviolet C light-emitting diodes corresponding to FIG. 4 and FIG. 5 may be the same as the structure of the ultraviolet C light-emitting diode 100 of FIG. 1. The difference between the two is that the concentration of magnesium in the electron blocking layer 200 in FIG. 4 is about $5\times10^{17}$ atoms/cm$^3$, and the concentration of magnesium in the electron blocking layer 200 in FIG. 5 is about $5\times10^{18}$ atoms/cm$^3$. In FIG. 4 and FIG. 5, the curve corresponding to $E_c$ is the lowest energy level of the conduction band, the curve corresponding to $Ef_n$ is the quasi-fermi energy level of the electron, the curve corresponding to $E_v$ is the highest energy level of the valence band, and the curve corresponding to $Ef_p$ is the quasi-fermi energy level of the hole. As shown in FIG. 4 and FIG. 5, when the concentration of magnesium in the electron blocking layer 200 is high, the conduction band barrier height difference ($\Delta E_c$) between conduction band barrier height of the second electron blocking layer 220 and the conduction band barrier height of the active layer 130 is larger, and the larger the effective conduction band barrier height difference ($\Delta E_c$), the electrons from the active layer 130 are less likely to overflow to the p-type semiconductor layer 120. In the embodiment of FIG. 1, the conduction band barrier formed by the second electron blocking layer 220 is 0.2 to 1 eV higher than the conduction band barrier formed by the active layer 130, thereby the effective conduction band barrier height difference ($\Delta E_c$) is 0.2 to 1 eV, which can effectively blocking the electrons from the active layer 130 from overflowing to the p-type semiconductor layer 120, thus effectively avoiding a decrease in luminous efficiency caused by the overflow of the electrons.

Figure 6:
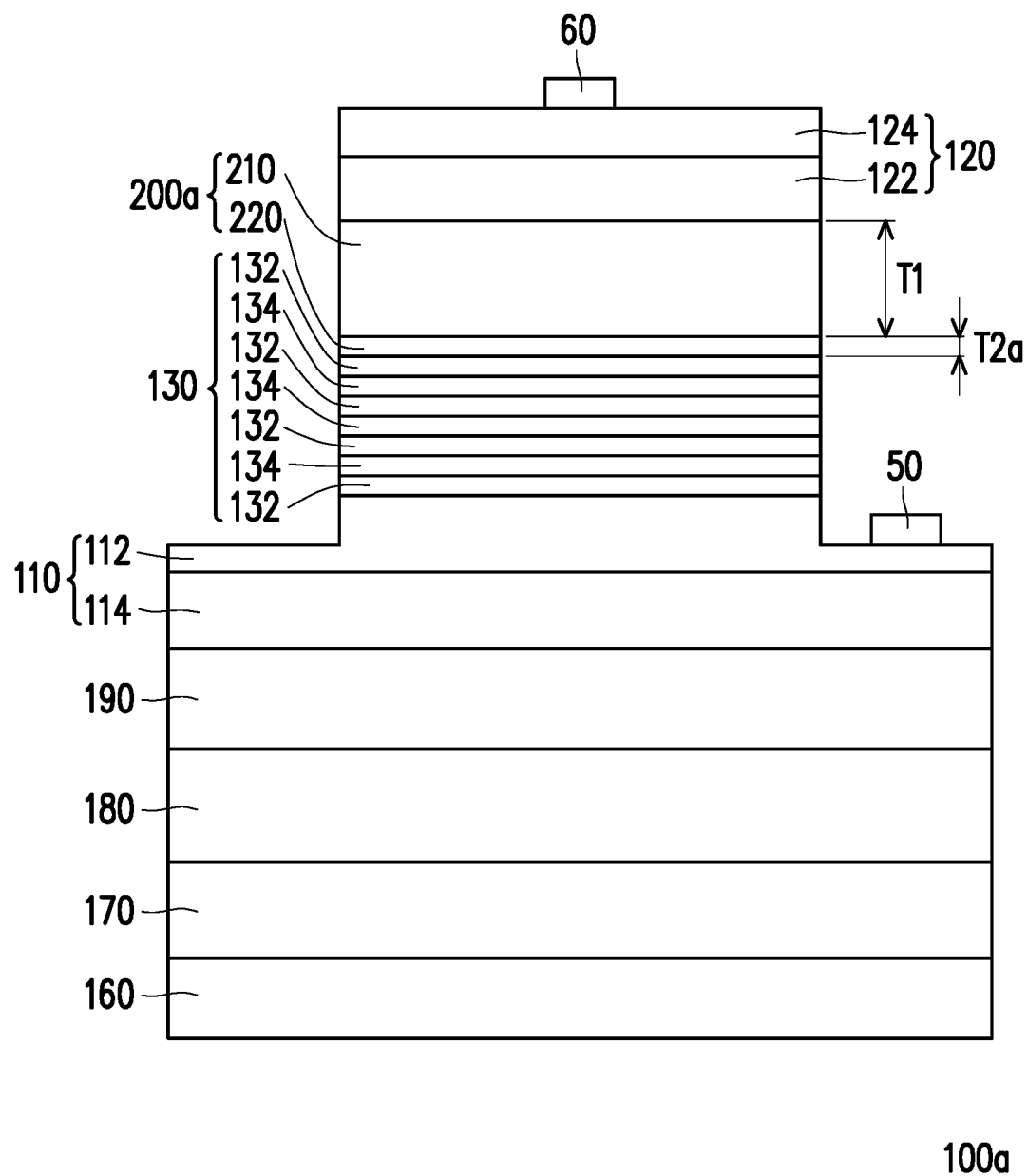
FIG. 6 is a schematic cross-sectional view showing an ultraviolet C light-emitting diode according to another embodiment of the disclosure.
Figure 7:
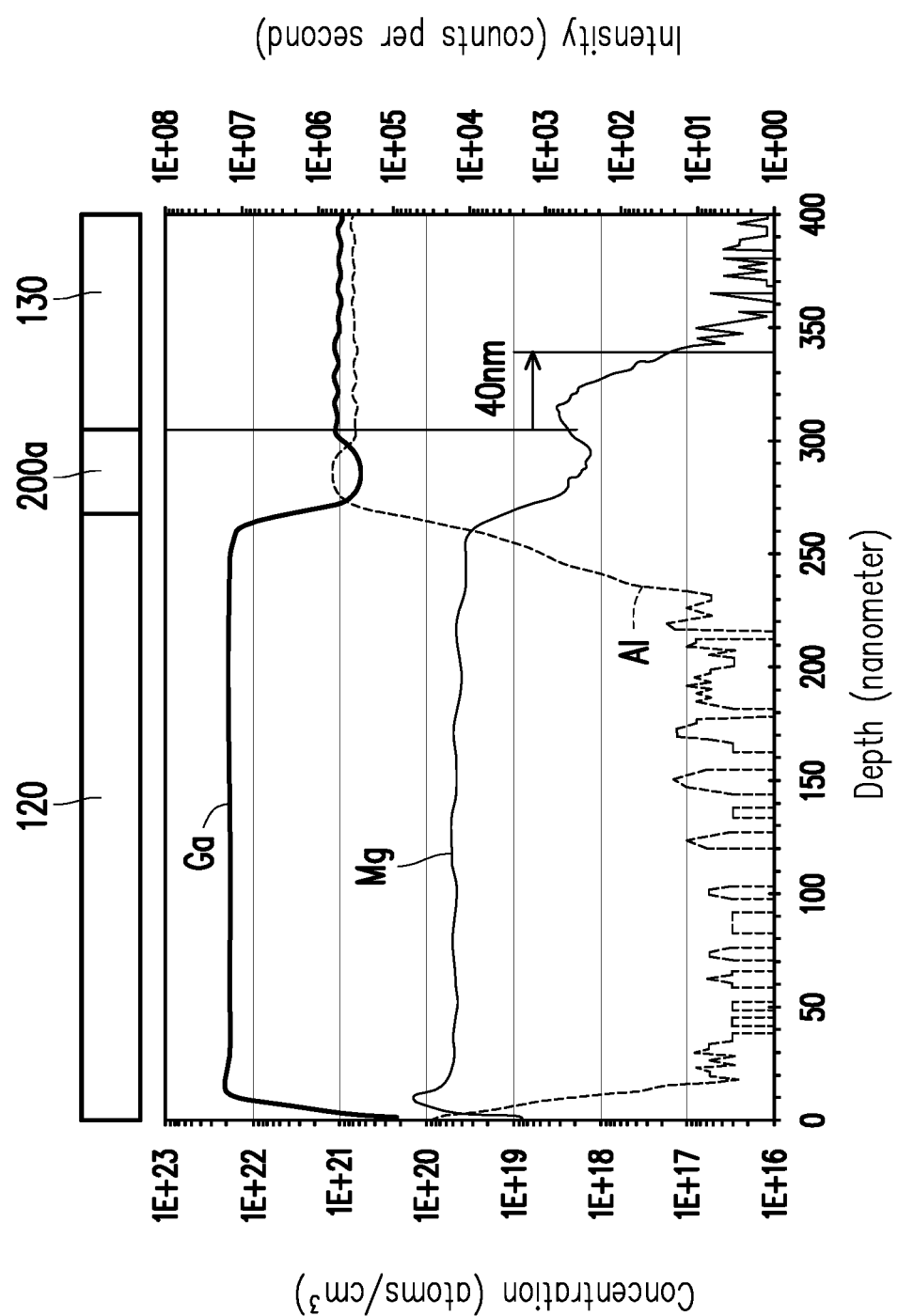
FIG. 7 is a diagram showing the ingredient distribution of an ultraviolet C light-emitting diode of a comparative example measured by a secondary ion mass spectrometer.
Figure 8:
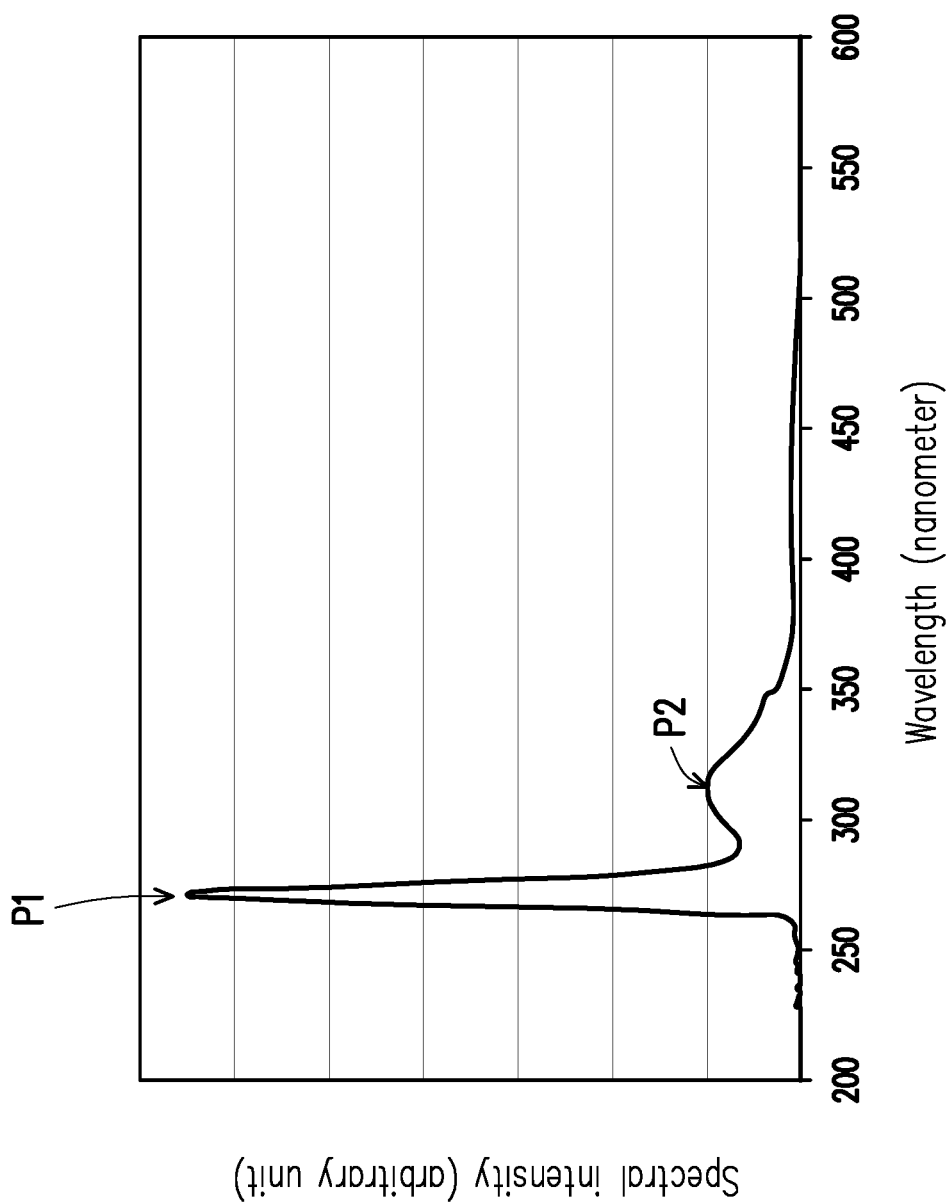
FIG. 8 is a spectrum diagram of the ultraviolet C light-emitting diode in comparative example of FIG. 7.

FIG. 6 is a schematic cross-sectional view showing an ultraviolet C light-emitting diode according to another embodiment of the disclosure. FIG. 7 is a diagram showing the ingredient distribution of an ultraviolet C light-emitting diode of a comparative example measured by a secondary ion mass spectrometer. FIG. 8 is a spectrum diagram of the ultraviolet C light-emitting diode in comparative example of FIG. 7. Referring to FIG. 6 first, the ultraviolet C light-emitting diode 100a of the present embodiment is similar to the ultraviolet C light-emitting diode 100 of FIG. 1, and the difference between the two is described as follows. In the ultraviolet C light-emitting diode 100a of the present embodiment, the second electron blocking layer 220 of the electron blocking layer 200a is located between the first electron blocking layer 210 and the active layer 130. In this embodiment, the thickness T2a of the second electron blocking layer 220 falls within a range of 0.1 nm to 10 nm, and the thickness T1 of the first electron blocking layer 210 falls within a range of 10 nm to 100 nm.

Figure 9:
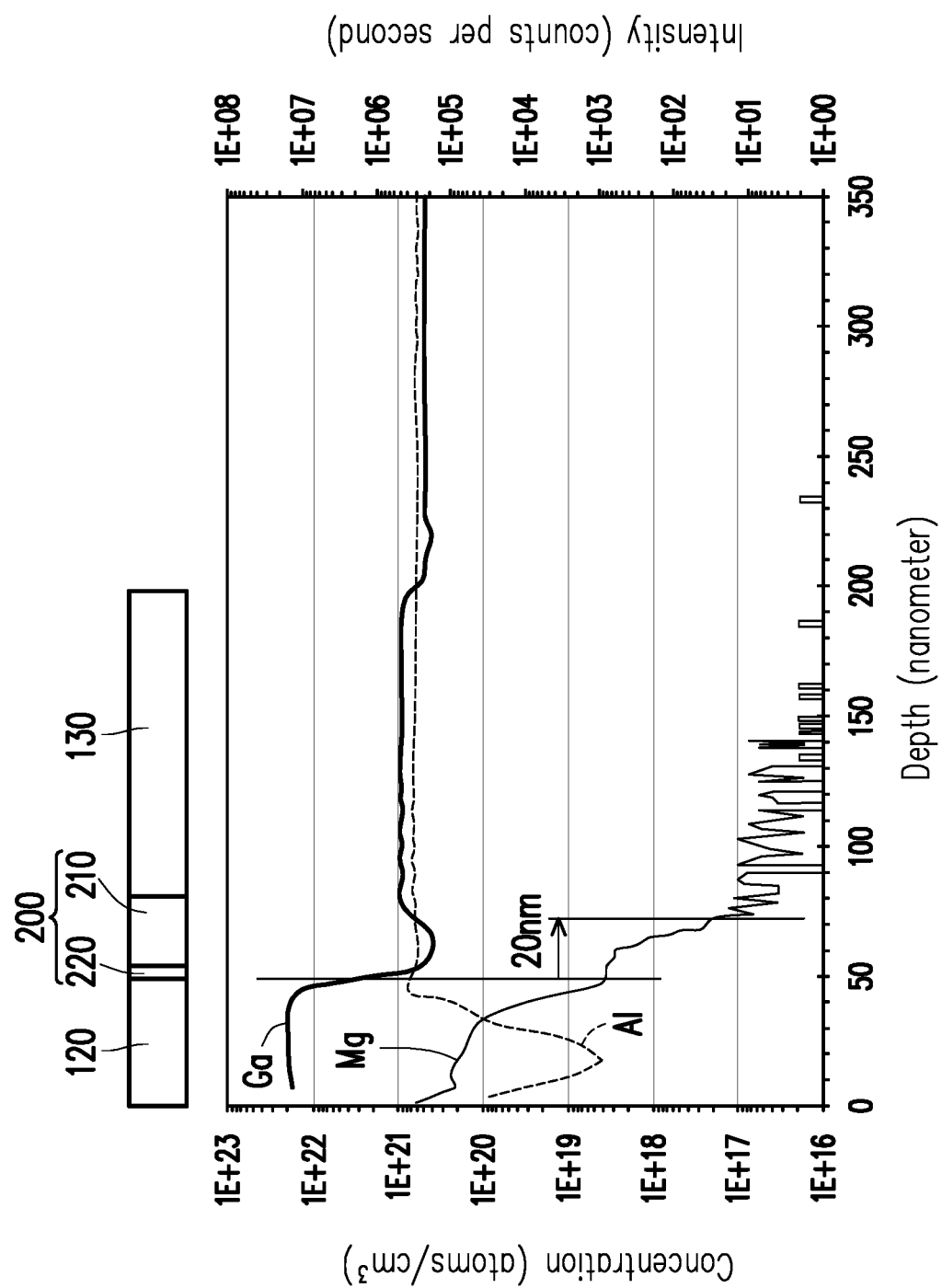
FIG. 9 is a diagram showing the ingredient distribution of an ultraviolet C light-emitting diode of another embodiment of the disclosure measured by a secondary ion mass spectrometer.
Figure 10:
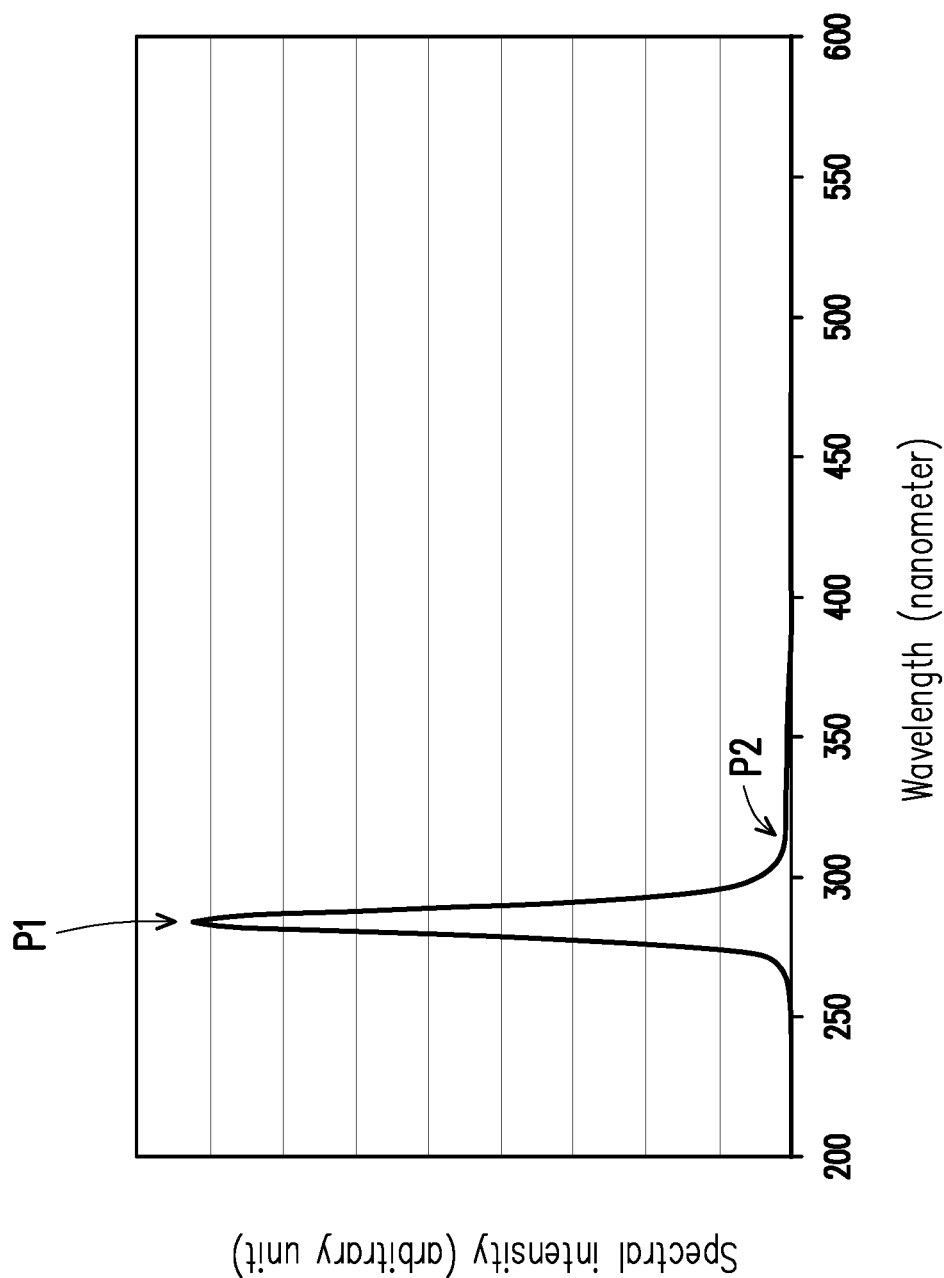
FIG. 10 is a spectrum diagram of an ultraviolet C light-emitting diode of the embodiment corresponding to FIG. 9.

Referring to FIG. 7 and FIG. 8 again, in this comparative example, as can be seen from FIG. 7, since the cationic molar fraction of aluminum in the active layer 130 is lower than that of the electron blocking layer 200, the magnesium ions in the second electron blocking layer 220 are easily diffused into the active layer 130 in a gradient distribution to cause defect illumination, and the second light-emitting peak P2 is thus more obvious in the spectrum diagram of FIG. 8. As a result, the luminous intensity or the light output power of the ultraviolet C light-emitting diode 100a of the comparative example became 5.4 mW. In order to reduce the diffusion of magnesium ions in the second electron blocking layer to the active layer 130 to cause defect illumination, in another embodiment of the disclosure, the electron blocking layer 200 may have a magnesium concentration distribution as shown in FIG. 9, that is, magnesium is doped in the electron blocking layer 200 in a specific doping ratio relationship to make magnesium less diffuse into the active layer 130 (please compare the concentration of magnesium in the active layer 130 in FIG. 7 and FIG. 9). On this occasion, it was found that such magnesium concentration distribution less causes defect illumination, and the second light-emitting peak P2 in the corresponding spectrum (shown in FIG. 10) is effectively suppressed and is not obvious, and is hardly seen. That is, this embodiment succeeds in making the luminous intensity of the first light-emitting peak P1 to be larger than 20 times the defect luminous intensity of the second light-emitting peak P2.

Figure 11:
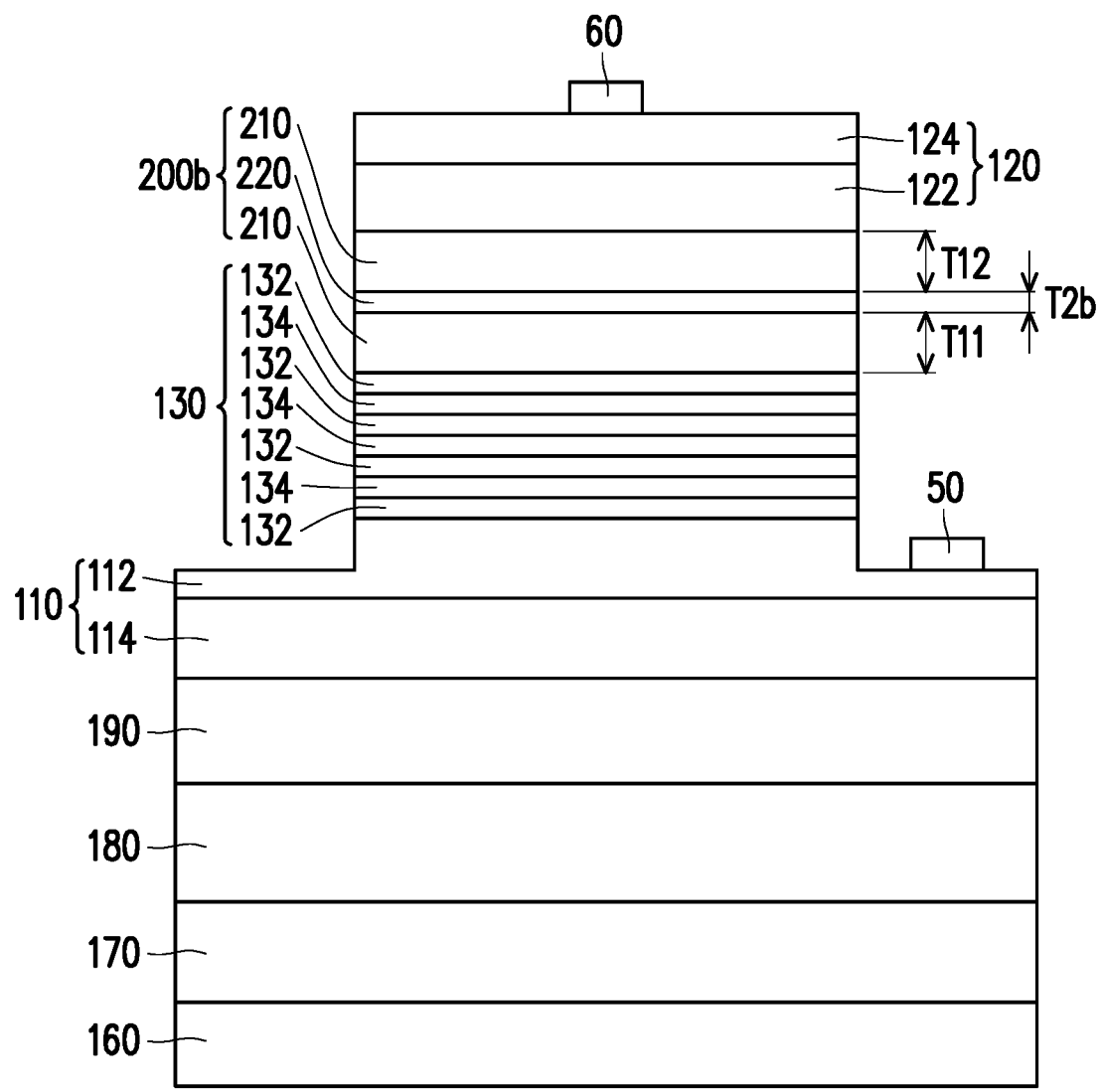
FIG. 11 is a schematic cross-sectional view showing an ultraviolet C light-emitting diode according to yet another embodiment of the disclosure.

FIG. 11 is a schematic cross-sectional view showing an ultraviolet C light-emitting diode according to yet another embodiment of the disclosure. Referring to FIG. 11, the ultraviolet C light-emitting diode 100b of the present embodiment is similar to the ultraviolet C light-emitting diode 100 of FIG. 1, and the difference between the two is described as follows. In the ultraviolet C light-emitting diode 100b of the present embodiment, the second electron blocking layer 220 of the electron blocking layer 200b is located in the first electron blocking layer 210. In the present embodiment, the thickness T2b of the second electron blocking layer 220 falls within the range of 0.1 nm to 15 nm, and the thickness (that is, the thickness T11 plus the thickness T12 in FIG. 11) of the first electron blocking layer 210 falls within the range of 10 nm to 100 nm.

Figure 12:
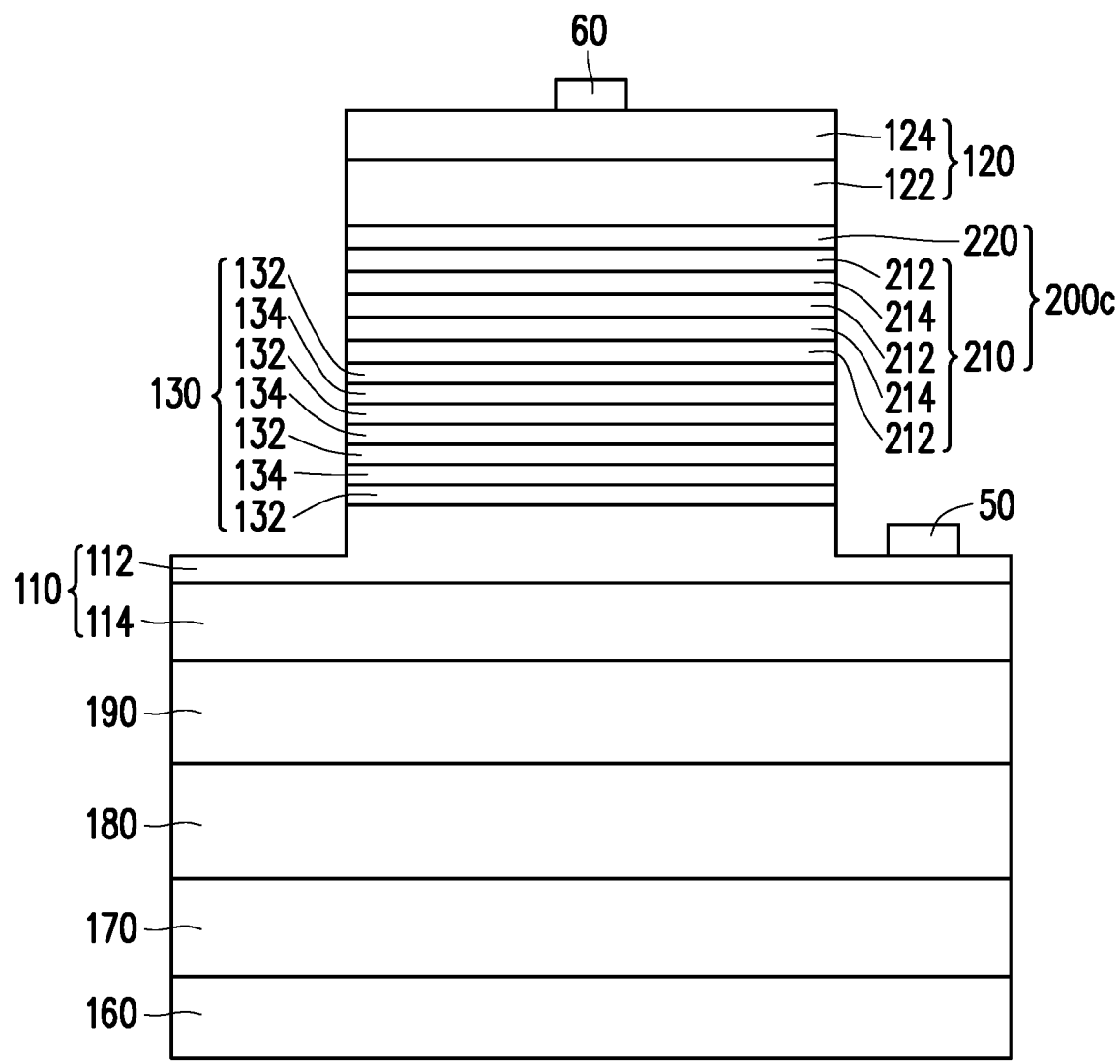
FIG. 12 is a schematic cross-sectional view showing an ultraviolet C light-emitting diode according to still another embodiment of the disclosure.

FIG. 12 is a schematic cross-sectional view showing an ultraviolet C light-emitting diode according to still another embodiment of the disclosure. Referring to FIG. 12, the ultraviolet C light-emitting diode 100c of the present embodiment is similar to the ultraviolet C light-emitting diode 100 of FIG. 1, and the difference between the two is described as follows. In the electron blocking layer 200c of the ultraviolet C light-emitting diode 100c of the present embodiment, the first electron blocking layer 210c has a superlattice structure. Specifically, the first electron blocking layer 210c has a plurality of first sub-layers 212 and a plurality of second sub-layers 214 that are alternately stacked, and the first sub-layers 212 and the second sub-layers 214 are both aluminum gallium nitride layers doped with magnesium, but the concentration of aluminum in the first sub-layers 212 is different from the concentration of aluminum in the second sub-layers 214. That is, the concentration of aluminum in the first electron blocking layer 210c is alternately changed up and down from the side close to the active layer 130 to the side close to the p-type semiconductor layer 120.

In contrast, in the embodiments of FIG. 2, FIG. 7, and FIG. 9, the concentration of aluminum of the first electron blocking layer 210 near the p-type semiconductor layer 120 is less than the concentration of aluminum of the first electron blocking layer 210 near the active layer 130, for example, the concentration of aluminum in the first electron blocking layer 210 gradually increases from the side close to the p-type semiconductor layer 120 toward the active layer 130, and the aluminum concentration difference between the aluminum concentration of the first electron blocking layer 210 near the p-type semiconductor layer 120 and the aluminum concentration of the first electron blocking layer 210 near the active layer 130 is about 5% cationic molar fraction. The concentration of gallium in the first electron blocking layer 210 near the p-type semiconductor layer 120 is greater than the concentration of gallium in the first electron blocking layer 210 near the active layer 130, and the gallium concentration difference between the gallium concentration of the first electron blocking layer 210 near the p-type semiconductor layer 120 and the gallium concentration of the first electron blocking layer 210 near the active layer 130 is about 5% cationic molar fraction.

In addition, in the embodiment of FIG. 12, the second electron blocking layer 220 may be disposed between the first electron blocking layer 210c and the active layer 130 or disposed in the first electron blocking layer 210c.

Each film layer of the ultraviolet C light-emitting diode of each embodiment of the disclosure may be fabricated by adopting a metal organic chemical vapor deposition (MOCVD) process or other suitable semiconductor manufacturing process, which is known to those of ordinary skill in the art and therefore will not be described in detail herein.

In summary, in the ultraviolet C light-emitting diode of the embodiment of the disclosure, since it is designed that the concentration of magnesium in the second electron blocking layer is greater than the concentration of magnesium in the first electron blocking layer, and the concentration of magnesium in the second electron blocking layer is greater than $10^{18}$ atoms/cm$^3$, through the doping of magnesium in a specific ratio relationship (for example, the above-mentioned magnitude relationship and numerical range regarding magnesium concentration, and, for example, the magnesium concentration distribution curves in FIG. 2 and FIG. 9), it is possible to effectively suppress the electrons in the active layer from overflowing to the p-type semiconductor layer, thereby improving the element performance of the ultraviolet C light-emitting diode.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An ultraviolet C light-emitting diode, comprising:
an n-type semiconductor layer;
a p-type semiconductor layer;
an active layer, disposed between the n-type semiconductor layer and the p-type semiconductor layer, wherein a wavelength of a maximum peak of a spectrum emitted by the active layer ranges from 230 nm to 280 nm, and a concentration of magnesium in the active layer is less than $10^{17}$ atoms/cm$^3$; and
a first electron blocking layer and a second electron blocking layer, which are disposed between the p-type semiconductor layer and the active layer, wherein a concentration of magnesium in the second electron blocking layer is greater than a concentration of magnesium in the first electron blocking layer, and the concentration of magnesium in the second electron blocking layer is greater than $10^{18}$ atoms/cm$^3$.

2. The ultraviolet C light-emitting diode of claim 1, wherein a spectrum of light emitted by the ultraviolet C light-emitting diode comprises a first light-emitting peak and a second light-emitting peak, and a spectral intensity of the first light-emitting peak is 20 or more times a spectral intensity of the second light-emitting peak.

3. The ultraviolet C light-emitting diode of claim 2, wherein a difference obtained by subtracting a wavelength of the first light-emitting peak from a wavelength of the second light-emitting peak falls within a range from 20 nm to 40 nm.

4. The ultraviolet C light-emitting diode of claim 1, wherein a highest magnesium concentration in the second electron blocking layer is 5 to 200 times a lowest magnesium concentration in the first electron blocking layer.

5. The ultraviolet C light-emitting diode of claim 1, wherein a magnesium concentration in the second electron blocking layer is ½ to 1/50 times a magnesium concentration in the p-type semiconductor layer.

6. The ultraviolet C light-emitting diode of claim 1, wherein a distribution curve of a magnesium whole concentration of the first electron blocking layer and the second electron blocking layer from the p-type semiconductor layer to the active layer is steep-down first and then flattened and then steep-down.

7. The ultraviolet C light-emitting diode of claim 1, wherein a refractive index of the second electron blocking layer is smaller than a refractive index of a well layer of the active layer, and the refractive index of the second electron blocking layer is smaller than a refractive index of a barrier layer of the active layer.

8. The ultraviolet C light-emitting diode of claim 1, wherein the second electron blocking layer is disposed between the first electron blocking layer and the p-type semiconductor layer.

9. The ultraviolet C light-emitting diode of claim 8, wherein a thickness of the second electron blocking layer falls within a range of 0.1 nm to 20 nm, and a thickness of the first electron blocking layer falls within a range of 10 nm to 100 nm.

10. The ultraviolet C light-emitting diode of claim 1, wherein the second electron blocking layer is disposed between the first electron blocking layer and the active layer.

11. The ultraviolet C light-emitting diode of claim 10, wherein a thickness of the second electron blocking layer falls within a range of 0.1 nm to 10 nm, and a thickness of the first electron blocking layer falls within a range of 10 nm to 100 nm.

12. The ultraviolet C light-emitting diode of claim 1, wherein the second electron blocking layer is disposed in the first electron blocking layer.

13. The ultraviolet C light-emitting diode of claim 12, wherein a thickness of the second electron blocking layer falls within a range of 0.1 nm to 15 nm, and a thickness of the first electron blocking layer falls within a range of 10 nm to 100 nm.

14. The ultraviolet C light-emitting diode of claim 1, wherein a cationic molar fraction of aluminum in the first electron blocking layer and the second electron blocking layer falls within a range of 60% to 80%.

15. The ultraviolet C light-emitting diode of claim 1, wherein a conduction band barrier formed by the second electron blocking layer is 0.2 to 1 eV higher than a conduction band barrier formed by the active layer.

16. The ultraviolet C light-emitting diode of claim 1, wherein the first electron blocking layer has a superlattice structure.

17. The ultraviolet C light-emitting diode of claim 1, wherein a concentration of gallium of the first electron blocking layer at a side close to the p-type semiconductor layer is greater than a concentration of gallium of the first electron blocking layer at a side close to the active layer.

18. The ultraviolet C light-emitting diode of claim 17, wherein an aluminum concentration difference between an aluminum concentration of the first electron blocking layer near the p-type semiconductor layer and an aluminum concentration of the first electron blocking layer near the active layer is about 5% cationic molar fraction.

19. The ultraviolet C light-emitting diode of claim 1, wherein an aluminum concentration of the first electron blocking layer at a side close to the p-type semiconductor layer is smaller than an aluminum concentration of the first electron blocking layer at a side close to the active layer.

20. The ultraviolet C light-emitting diode of claim 19, wherein a gallium concentration difference between a gallium concentration of the first electron blocking layer near the p-type semiconductor layer and a gallium concentration of the first electron blocking layer near the active layer is about 5% cationic molar fraction.

* * * * *